United States Patent
Singor

(10) Patent No.: US 6,437,620 B1
(45) Date of Patent: Aug. 20, 2002

(54) CIRCUIT AND METHOD FOR MULTI-PHASE ALIGNMENT

(75) Inventor: Frank W. Singor, Laguna Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/920,709

(22) Filed: Aug. 3, 2001

Related U.S. Application Data

(60) Provisional application No. 60/224,169, filed on Aug. 9, 2000, and provisional application No. 60/223,112, filed on Aug. 3, 2000.

(51) Int. Cl.$^7$ ............................................... H03K 3/017
(52) U.S. Cl. ...................................... 327/172; 327/248
(58) Field of Search ................................. 327/172, 170, 327/24, 171, 361, 248

(56) References Cited

U.S. PATENT DOCUMENTS

| | | | |
|---|---|---|---|
| 4,504,792 A | * 3/1985 | Furihata | 329/327 |
| 5,218,448 A | * 6/1993 | Honjo et al. | 386/22 |
| 5,631,997 A | * 5/1997 | Anzai | 360/65 |
| 5,638,016 A | 6/1997 | Eitrheim | 327/175 |
| 5,675,273 A | 10/1997 | Masleid | 327/156 |

FOREIGN PATENT DOCUMENTS

| | | | | |
|---|---|---|---|---|
| GB | 2 157 519 A | 10/1985 | ......... | H03K/17/00 |
| JP | 2000-013204 A | 1/2000 | ............ | H03K/5/13 |

OTHER PUBLICATIONS

Copy of International Search Report for International Application No. PCT/US01/41533, filed Aug. 3, 2001.

Anonymous, "CMOS Delay Circuit," IBM Technical Disclosure Bulletin, vol. 27, No. 12, May 1995, pp. 7134–7135.

* cited by examiner

*Primary Examiner*—Timothy P. Callahan
*Assistant Examiner*—Cassandra Cox
(74) *Attorney, Agent, or Firm*—Sterne, Kessler, Goldstein & Fox P.L.L.C.

(57) ABSTRACT

A method and circuit for adjusting clock pulse widths in a high speed sample and hold circuit. A single phase clock signal is input into a pulse discriminator and separated into rising and falling edges. The edges are adjusted to a desired slope. The adjusted edges and the unadjusted edges are summed and output as multiple clock signals with a desired pulse edge alignment. The clock signals control switches in a manner to reduce signal dependent sampling distortion.

10 Claims, 11 Drawing Sheets

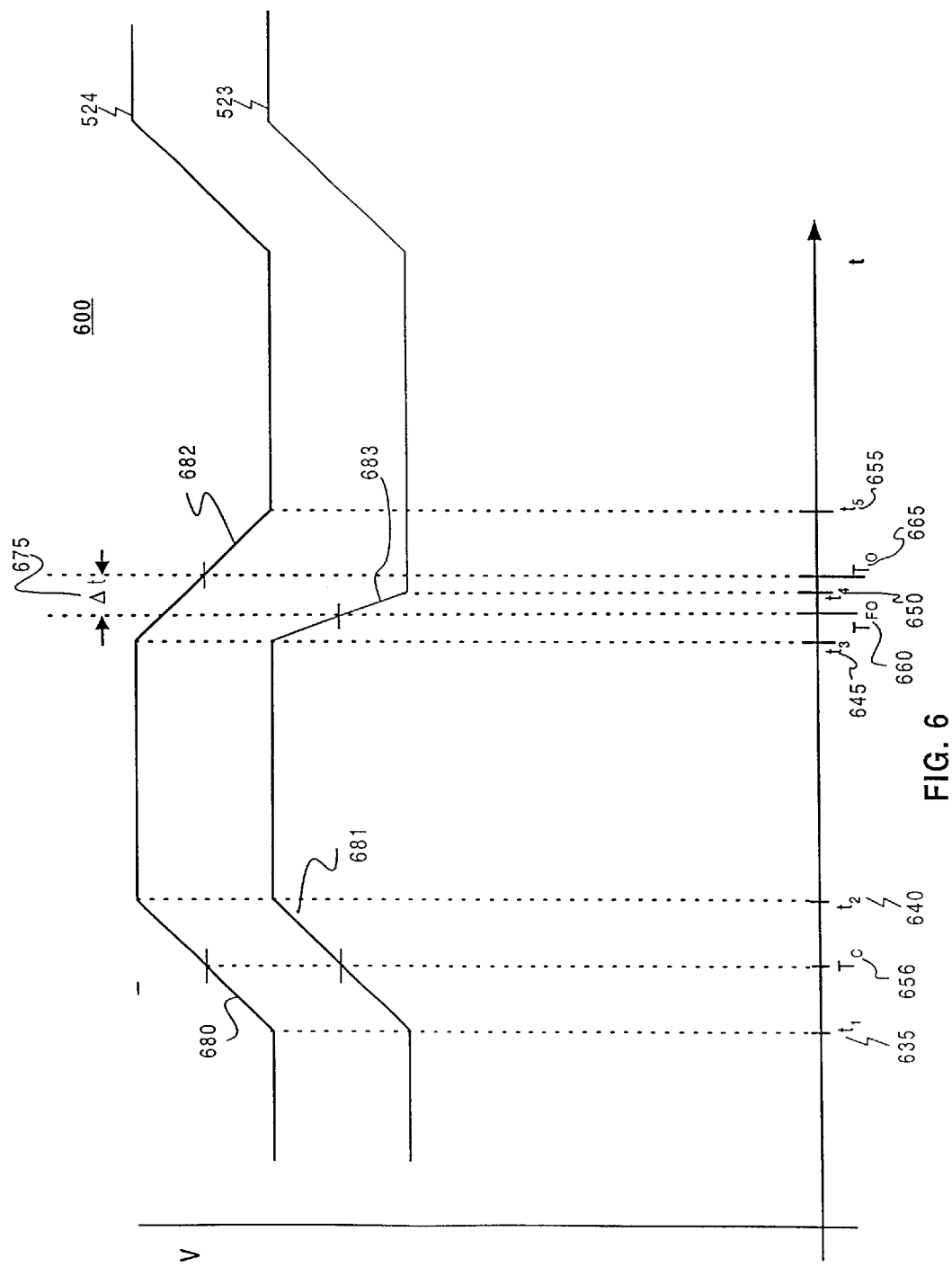

CIRCUIT AND METHOD FOR MULTI-PHASE ALIGNMENT

CROSS-REFERENCE TO RELATED APPLICATIONS

This application claims benefit of U.S. Provisional Application No. 60/223,112 filed Aug. 3, 2000 and, U.S. Provisional Application No. 60/224,169 filed Aug. 9, 2000 both of which are incorporated by reference herein in their entirety.

BACKGROUND OF THE INVENTION

1. Field of the Invention

This invention relates to high speed sampling circuits. More particularly, the invention relates to a circuit and method for reducing sampling distortion.

2. Background Art

A sample and hold circuit periodically captures the amplitude of a variable analog signal. In many sample and hold circuits, distortion is produced by circuit components that limit the useful voltage range of an input signal or limit the useful frequency of the input signal. Distortion may be produced, for example, by nonlinear resistance characteristics of switches in the sample and hold circuits that are caused by effects such as field effect transistor (FET) threshold turnoff, bulk effect, or manufacturing variations. Distortion may also be produced by parasitic capacitances of switches in the sample and hold circuit, nonlinear load currents in the input source resistance that are caused by semiconductor junctions of switches in the sample and hold circuits, and terminal resistance of switches in the sample and hold circuits.

These distortions are generally nonlinear functions of the applied input voltage. In a sampling circuit, the applied input voltage is the signal to be sampled. This type of sampling is called signal dependent sampling. In applications requiring low distortion and high sample fidelity, signal dependent sampling is undesirable.

Various methods are used to eliminate the distortion caused by signal dependent sampling. These methods include active cancellation circuitry, multiple sample circuits, and other distortion cancellation methods requiring additional complex and expensive circuit components. In one method, an auxiliary sampling circuit is added to produce canceling distortion that is proportionally larger with respect to the sampled signal than the distortion produced in the main sampling circuit.

A simple and inexpensive method of eliminating signal dependent sampling distortion is to isolate the sample hold device from the distortion causing events. This method locks the sample value in the hold device before opening the sampling switch and initiating the distortion causing event. This method is simple to implement and requires only minor hardware changes. However, there are limitations in the sample and hold control circuitry that prohibit its use at high sampling rates.

What is needed is a circuit and method for eliminating distortion, caused by signal dependant sampling, that does not require complex or expensive circuitry and is suitable for use in high speed sampling applications.

BRIEF SUMMARY OF THE INVENTION

The invention comprises a circuit and method for aligning pulse edges used to control a sample and hold circuit. The multi-phase alignment circuit comprises an edge discriminator connected to a first summer, a second summer, and a rate adjuster. The second summer is also connected to the rate adjuster. The edge discriminator receives a clock signal and separates the clock signal into rising and falling edges. The rate adjuster adjusts the slope of one of the falling edges to a desired value. The rising edges and the falling edges are summed in the first summer and output as a clock signal. The rising edges and the adjusted falling edges are summed in the second summer and output as an adjusted clock signal. The rising edges of the clock signal and the adjusted clock signal are aligned. The clock signal and adjusted clock signal control a high speed sample and hold circuit.

BRIEF DESCRIPTION OF THE FIGURES

The present invention is described with reference to the accompanying drawings. In the drawings, like reference numbers indicate identical or functionally similar elements. Additionally, the leftmost digit(s) of a reference number identifies the drawing in which the reference number first appears.

FIG. 6 illustrates details of improved control signal waveforms.

DETAILED DESCRIPTION OF THE INVENTION

Before describing the invention in detail, it is useful to describe an example of a sampling circuit containing the invention. The multi-phase alignment circuit invention is not limited to the sampling circuit that is described herein. The multi-phase alignment circuit invention is applicable to other sampling and non-sampling applications as will be understood to those skilled in the relevant arts based on the discussions given herein.

Figure 1:
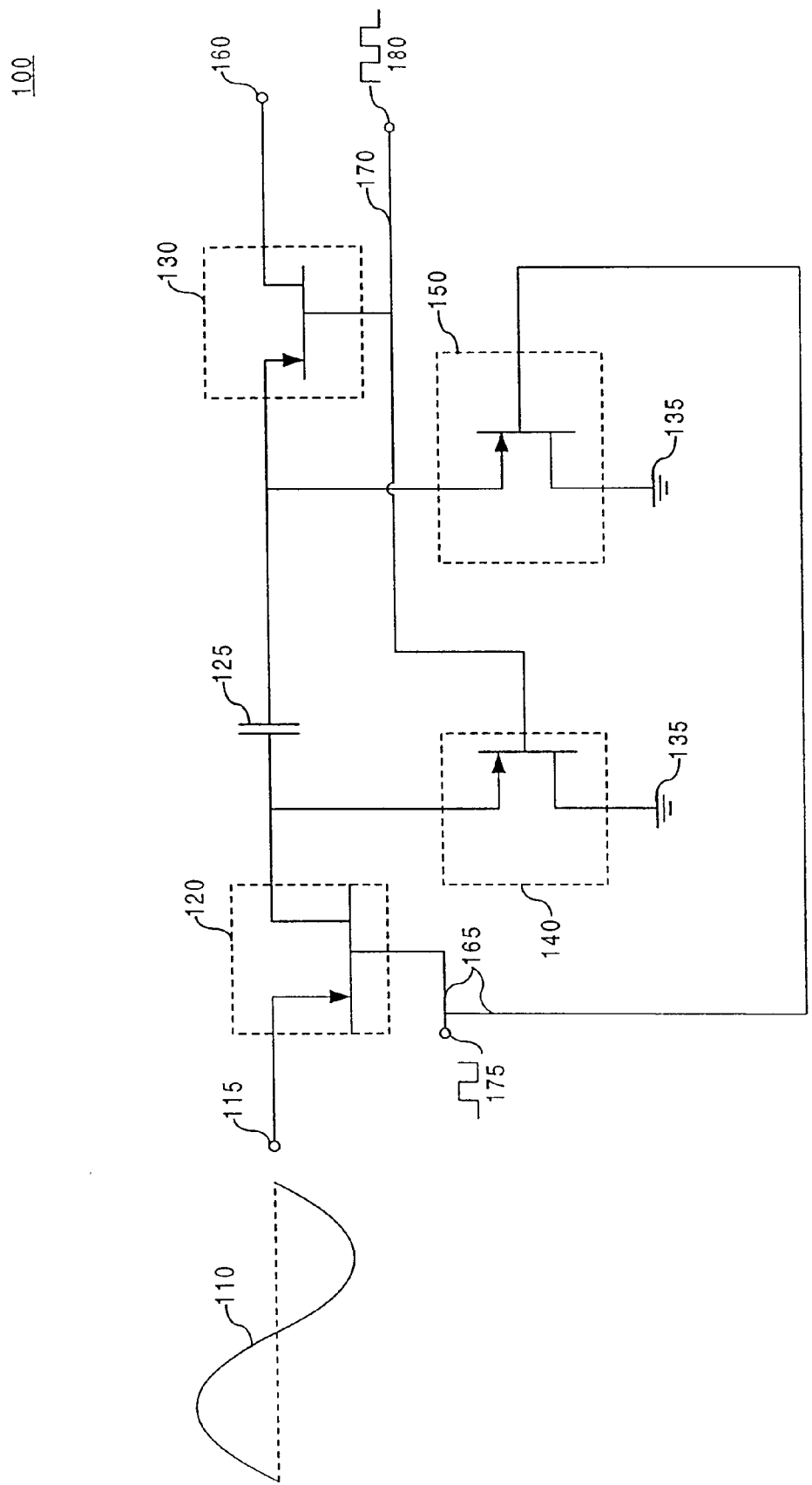
FIG. 1 illustrates a sample and hold circuit.

FIG. 1 illustrates a sample and hold circuit 100. The sample and hold circuit 100 comprises an input 115, a sample switch 120, a hold capacitor 125, an output switch 130, an output 160, an output ground switch 140, a sample ground switch 150, a sample control line 165, an output control line 170 and a ground 135. The sample switch 120 and the sample ground switch 150 are open and closed by a sample control signal 175 on the sample control line 165. The output switch 130 and the output ground switch 140 are open and closed by an output control signal 180 on the output control line 170.

The sample and hold cycle begins when the output control signal 180 opens the output switch 130 and the output ground switch 140. The sample control signal 175 closes the sample switch 120 and the sample ground switch 150. A sampled signal 110 charges the hold capacitor 125 to a voltage representative of the sampled signal 110. The sample control signal 175 opens the sample switch 120 and sample switch ground 150 isolating the hold capacitor 125 from the sampled signal 110. The output control signal 180 closes the output switch 130 and the output ground switch 140, applying the voltage on the hold capacitor 125 to the output 160. The voltage at the output 160 is representative of the sampled signal 110 at the sample time. An external circuit discharges the hold capacitor 125 and the sample and hold cycle is complete.

In an embodiment of the sample and hold circuit 100, the sample switch 120, the output switch 130, the output ground switch 140, and the sample ground switch 150 are field effect transistors (FETs). Each FET comprises a gate, a source, and a drain. The sample control line 165 is coupled to the sample switch 120 gate and the sample ground switch 150 gate. The output control line 170 is coupled to the output switch 130 gate and the output ground switch 140 gate. The sample switch 120 source is coupled to the input 115. The sample control signal 175 causes the sample switch 120 and the sample ground switch 150 to open and closed by applying a desired voltage to the sample switch 120 gate and the sample ground switch 150 gate. The output control signal 180 causes the output switch 130 and the output ground switch 140 to open and closed by applying a desired voltage to the output switch 130 gate and the output ground switch 140 gate.

The sampled signal 110 is applied to the input 115 and the sample switch 120 source. A time varying sampled signal 110 causes a time varying voltage at the sample switch 120 source.

Figure 2:
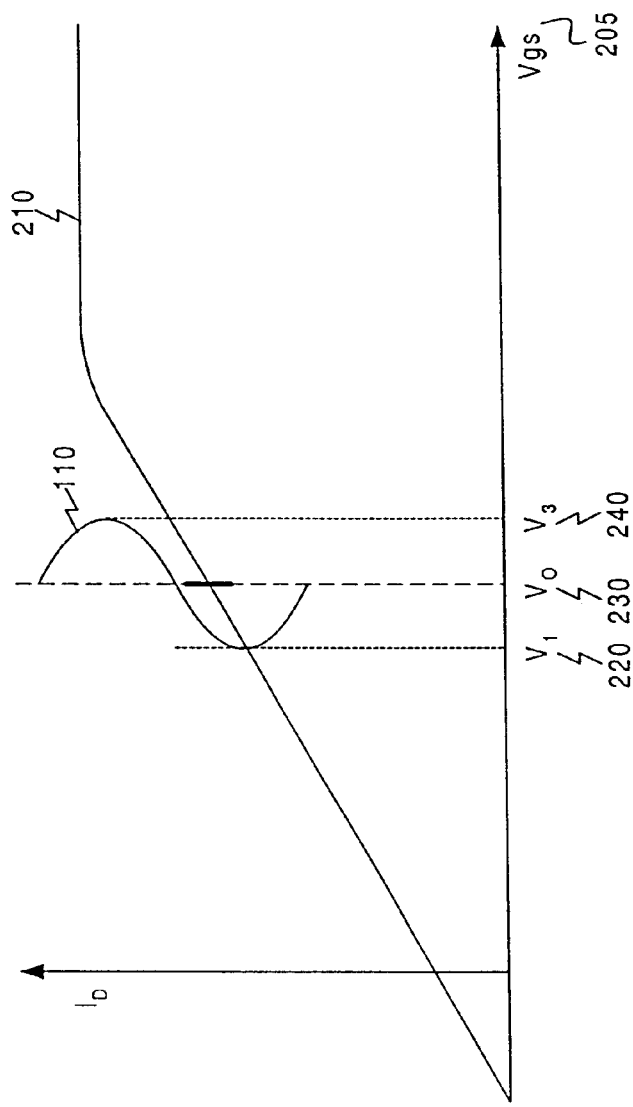
FIG. 2 illustrates the operating characteristics of a semiconductor switch.

FIG. 2 illustrates a characteristic curve 210 of a field effect transistor biased to operate as the sampling switch 120. The voltage measured between the sample switch 120 gate and the sample switch 120 source is a $V_{GS}$ 205. Referring to FIG. 2, the sampled input 110 is superimposed on a characteristic curve 210 to illustrate the effect of varying the $V_{gs}$ 205 on the sample switch 120. With the voltage at the sample switch 120 gate constant, the $V_{gs}$ 205 varies between a $V_1$ 220 and a $V_3$ 240 according to the instantaneous magnitude of the sampled signal 110.

The sample switch 120 is biased to open when $V_{gs}$ 205 is equal to $V_o$ 230. The condition for $V_{GS}$ 205=$V_o$ 230 depends on the sum of the sampled signal 110 and the sample control signal 175. The sample switch 120 could open before, or after the sample control signal 175 reaches the $V_o$ 230. The variation in the sample switch 120 opening times causes a sample signal dependent variation in the voltage on the hold capacitor 125 and thus a signal dependent distortion in the sampled value. In addition, if the input signal 110 is large enough, the sample switch 120 could still be closed when the output control signal 180 closes the output ground switch 140, grounding the input signal 110. The signal and timing distortion caused by signal dependent sampling is undesirable.

Figure 3:
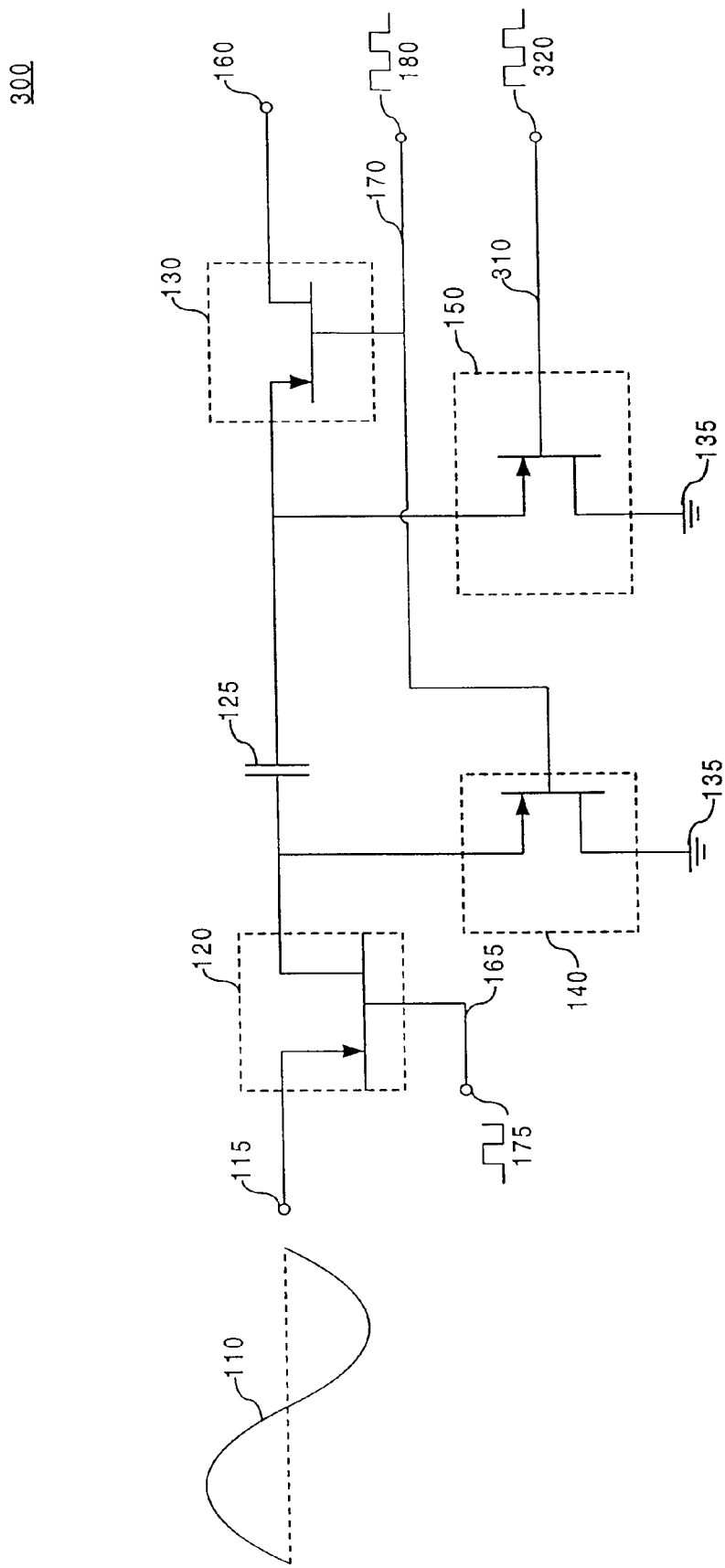
FIG. 3 illustrates an improved sample and hold circuit.

FIG. 3 illustrates a modified sample and hold circuit 300. The modified sample and hold circuit 300 comprises the sample and hold circuit 100, a sample ground control line 310, and a sample ground control signal 320. The sample control line 165 is uncoupled from the sample ground switch 150. A sample ground control signal 320 is coupled to the sample ground switch 150 through the sample ground control line 310.

The modified sample and hold circuit 300 eliminates signal dependent sampling by opening the sample ground switch 150 just prior to opening the sample switch 120.

Referring to FIG. 3, the sample and hold cycle begins when the output control signal 180 opens the output switch 130 and the output ground switch 140. The sample control signal 175 closes the sample switch 120 and simultaneously, the sample ground control signal 320 closes the sample ground switch 150. The sampled signal 110 charges the hold capacitor 125 to a voltage representative of the sampled signal 110. The sample ground control signal 320 opens the sample ground switch 150, isolating the hold capacitor 125 from the ground 135. The sample control signal 175 opens the sample switch 120. The output control signal 180 closes the output switch 130 and the output ground switch 140, applying voltage on the hold capacitor 125 to the output 160. The voltage at output 160 is representative of the sample taken. An external circuit discharges the hold capacitor 125 and the sample and hold cycle is complete.

When the sample ground switch 150 is opened the hold capacitor 125 is placed in an open circuit condition. The quantity of charge on the hold capacitor 125 is fixed and unaffected by distortions associated with opening the sample switch 120. The sample ground switch 150 is not affected by the input signal 110, therefore the sample distortion caused by isolating the hold capacitor 125 with the sample switch 120 is eliminated and signal dependent sampling is prevented.

Figure 4A:
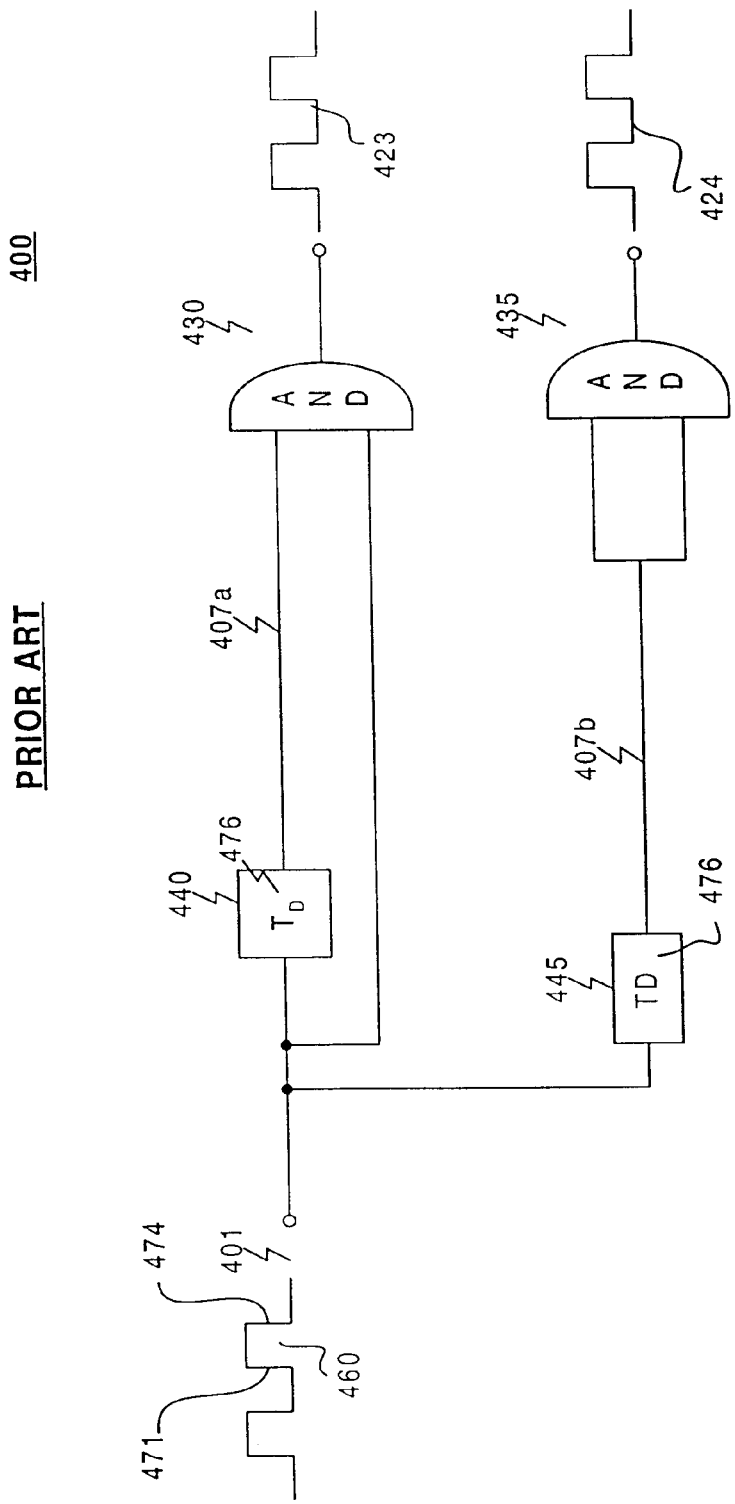
FIG. 4A illustrates a circuit for generating control signals.

FIG. 4A illustrates a control signal generator 400 for producing control signals for modified sample and hold circuit 300. The control signal generator 400 is presented to highlight the differences between the present invention and an existing method of generating control signals with specific pulse edge alignments.

The control signal generator 400 comprises an input 401 coupled to a first delay 440 and a first AND gate 430. The first delay 440 is coupled to the first AND gate 430. A second delay 445 is coupled between the input 401 and a second AND gate 435.

An input clock signal 460 is applied to the input 401. The input clock signal 460 is delayed a $T_D$ 476 by the first delay 440 and is output as a delayed clock signal 407a. The input clock signal 460 and the delayed clock signal 407a are logical AND'ed in the first AND gate 430 and output as an adjusted clock signal 423. The input clock signal 460 is delayed $T_D$ 476 by the second delay 445 to create a delayed clock signal 407b. The delayed clock signal 407b is logical AND'ed with the delayed clock signal 407b in the second AND gate 435 and output as a clock signal 424.

The clock signal 424 is coupled to the sample control line 165 and the adjusted clock signal 423 is coupled to the sample ground control line 310. These connections allow the control signal generator 400 to control the modified sample and hold circuit 300. The sample switch 120 is closed by a positive transition on the sample control line 165. The sample ground switch 150 is closed by a positive transition on the sample ground control line 310. The sample switch 120 is opened by a negative transition on the sample control line 165. The sample ground switch 150 is opened by a negative transition on the sample ground control line 310.

Figure 4B:
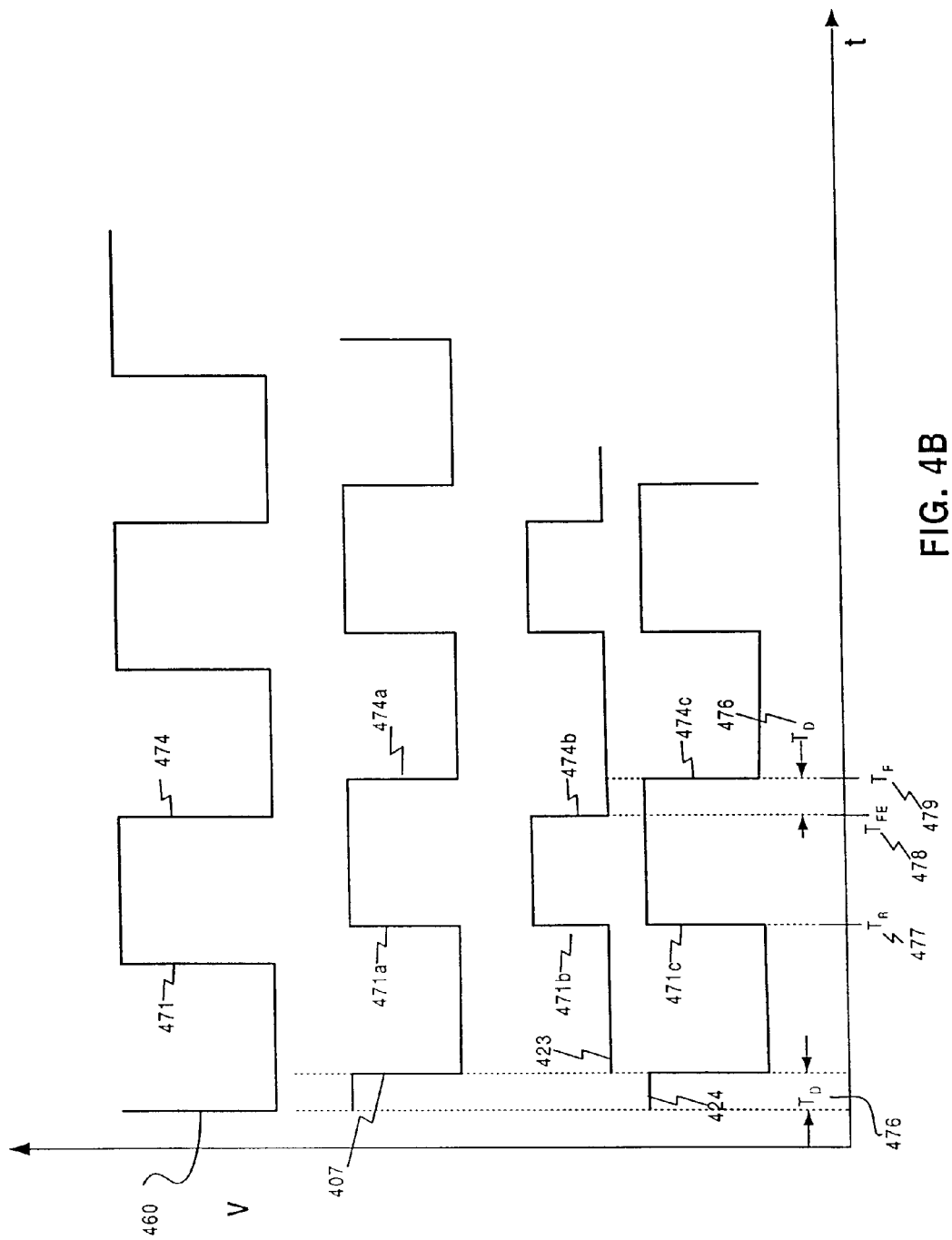
FIG. 4B illustrates details of control signal waveforms.

FIG. 4B illustrates timing details between the input clock signal 460, the delayed signal 407, the adjusted clock signal 423, and the clock signal 424.

The input clock signal 460 is generated by an external circuit and coupled to the input 401. Methods for generating clock signals are well known and one of skill in the art will understand how to generate the input clock signal 460. The input clock signal 460 comprises a rising edge 471 and a falling edge 474. The delayed clock signal 407 comprises a rising edge 471a and a falling edge 474a. The adjusted clock signal 423 comprises an adjusted clock rising edge 471b and an adjusted clock falling edge 474b. The clock signal 424 comprises a clock rising edge 471c and a clock falling edge 474c.

The delayed clock signal 407 is input clock signal 460 delayed by $T_D$ 476. The adjusted clock signal 423 is delayed clock signal 407a logical AND'ed with input clock signal 460. The clock signal 424 is delayed clock signal 407b logical AND'ed with the delayed clock signal 407b.

To open the sample ground switch 150 before the sample switch 120, the adjusted clock falling edge 474b must occur before the clock falling edge 474c. The adjusted clock falling edge 474b and the clock signal falling edge 474c are staggered by TD 476. The adjusted clock signal rising edge 471b and the clock signal rising edge 471c are each delayed from input clock signal 460 by TD 476.

The clock signal 424 and the adjusted clock signal 423 must be aligned to provide an adequate period for electrical transients to attenuate. This period is known as circuit settling. If the circuit settling time is inadequate, transients generated in one sample cycle could be present in subsequent cycles. Unsettled transients are unpredictable and undesirable. As the sampling rate is increased, sample period decreases. Finding adequate time for circuit settling becomes an upper limit to further increasing the sampling rate. Any portion of the clock period recovered from inefficient use can be applied to circuit settling time while increasing the sampling rate.

In one embodiment, the multi-phase alignment circuit will operate with an eight-nanosecond sample period. At that sampling rate the circuit settling time is four nanoseconds. That allows four nanoseconds for the clock signal 424 and the adjusted clock signal 423 to transition high, the sample switch 120 and the sample ground switch 150 to close, the adjusted clock signal 423 to transition low, the sample ground switch 150 to open, clock signal 424 to transition low, and the sample switch 120 to open.

To maximize the available settling time within a given clock period, the clock rising edge 471c and the adjusted clock rising edge 471b must be aligned to transition high, closing the sampling switch 120 and the second sampling switch 150 simultaneously. Misalignment between the clock rising edge 471c and the adjusted clock rising edge 471b delays the start of the settling period. The interval between $T_R$ 477 and $T_{FE}$ 478 defines the clock period available for circuit settling. If the clock rising edge 471c occurs before the adjusted clock rising edge 471b, the settling time is reduced. If the adjusted clock rising edge 471b occurs before the adjusted clock rising edge 471c, the settling time will also be reduced. To ensure alignment TD 476 in the first delay 440 must equal TD 476 in the second delay 445. Any difference staggers the clock rising edge 471c and the adjusted clock rising edge 471b.

The alignment of the clock falling edge 474c and the adjusted clock falling edge 474b also affects circuit settling time. The difference between $T_{FE}$ 478 and $T_F$ 479 is TD 476. If the clock rising edge 471c and the adjusted clock rising edge 471b are aligned at $T_R$ 477 then the circuit settling time equals ($T^F$ 479 minus $T_R$ 477) minus $T_D$ 476. The maximum circuit settling interval occurs when $T_D$ 476 is at its minimum.

Time delays are implemented in integrated circuits using simple devices or elements coupled in series. The total delay is the sum of the individual elements. The total delay=$T_D$ 476. A simple semiconductor inverter has an inherent signal delay of about one nanosecond. In circuits where $T_D$ 476 is many nanoseconds, many delay elements can be used and $T^D$ 476>>a single element delay. Increasing or decreasing $T_D$ 476 is accomplished by adding or removing elements. However, as sampling rate increases, $T_D$ 476 is reduced to maintain circuit settling time. Eventually, $T_D$ 476 will be equal to the delay inserted by one element. In circuits using delayed control signals, the delay inserted by one device is the minimum $T_D$ 476 and therefore determines the maximum sample rate for a fixed settling time. In high speed sampling, a single inverter sets $T^D$ 476≅ one nanosecond, which uses twenty-five percent of the available clock period.

If the first delay 440 and the second delay 445 do not have an identical $T_D$ 476, the rising edges will be staggered. The staggered edges cause the sample switch 120 and the sample ground switch 150 to close sequentially. The delay between the first switch closing and the second switch closing uses clock period and does not count as settling time.

A multi-phase clock generator is needed to overcome the disadvantages of delay based clock generators.

Figure 5A:
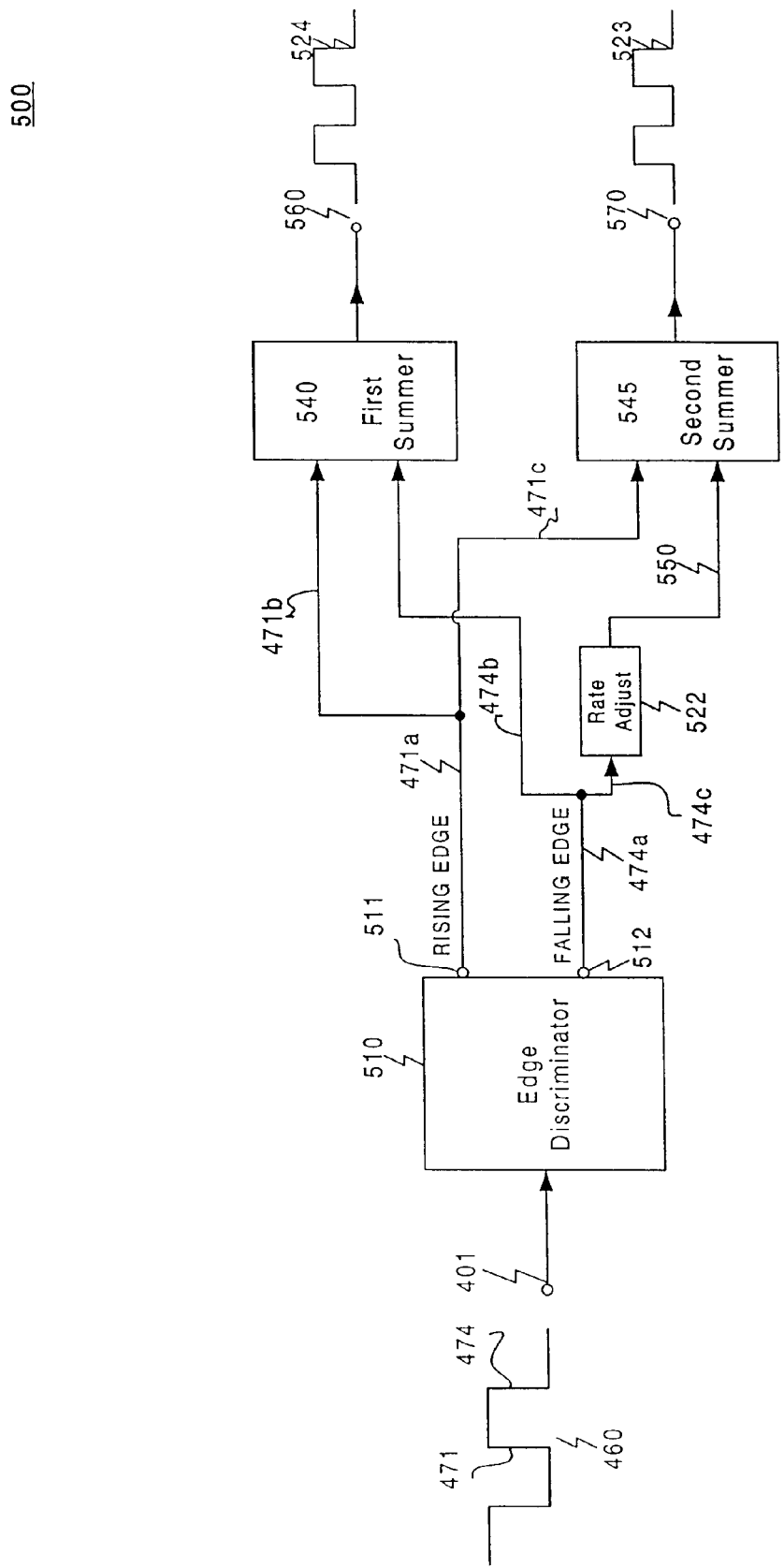
FIG. 5A illustrates an improved circuit for generating control signals.

FIG. 5A illustrates a multi-phase alignment circuit 500. The multi-phase alignment circuit 500 comprises an edge discriminator 510 coupled to an input 401, a rise output 511, and a fall output 512. The rise output 511 is coupled to a first summer 540 and a second summer 545. The fall output 512 is coupled to the first summer 540 and a rate adjust 522. The rate adjust 522 is coupled to the second summer 545. First summer 540 is coupled to a clock output terminal 560 and second summer 545 is coupled to an adjusted clock output terminal 570.

The edge discriminator 510 responds to a rising edge 471 on the input clock 460 by generating a rising edge signal 471a at the rise output 511. The start, slope, and duration of the rising edge signal 471a is proportional to the rising edge 471. When the rising edge 471 ends, the rising edge signal 471a remains a constant positive value. When a falling edge 474 of the input clock 460 is detected, the rising edge signal 471a is not generated. The rising edge signal 471a is aligned with the rinsing edge 471.

The edge discriminator 510 responds to the falling edge 474 by generating a falling edge signal 474a at the fall output 512. The start, slope, and duration of the falling edge signal 474a is proportional to the falling edge 474. When the falling edge 474 ends, the falling edge signal 474a remains at a zero reference value. When the rising edge 471 is detected, the falling edge signal 474a is not generated. The falling edge signal 474a is aligned with the falling edge 474.

Referring to FIG. SA, the rising edge signal 471a is divided into a rising edge signal 471b and a rising edge signal 471c. The rising edge signal 471b is coupled into the first summer 540 and the rising edge signal 471c is coupled into the second summer 545. The falling edge signal 474a is also divided into a falling edge signal 474b and a falling edge signal 474c. The falling edge signal 474b is coupled to the first summer and the falling edge signal 474c is coupled to the rate adjust 522.

The rate adjust 522 responds to the falling edge signal 474c by generating an adjusted falling edge signal 550 with the same initial amplitude but a greater slope than the falling edge signal 474c. The adjusted falling edge signal 550 reaches the zero reference value before the falling edge signal 474a.

The first summer 540 functions to combine the rising edge signal 471b and the falling edge signal 474b into a clock signal 524. The second summer 545 functions to combine the rising edge signal 471c and the adjusted falling edge signal 550 into an adjusted clock signal 523. The clock signal 524 is aligned with the input clock 460. The adjusted clock signal 523 is aligned to the rising edge 471 but is offset at the end of the adjusted falling edge signal 550 by an interval proportional to the difference in the slope of the falling edge 474b and the adjusted falling edge 550.

Figure 5B:
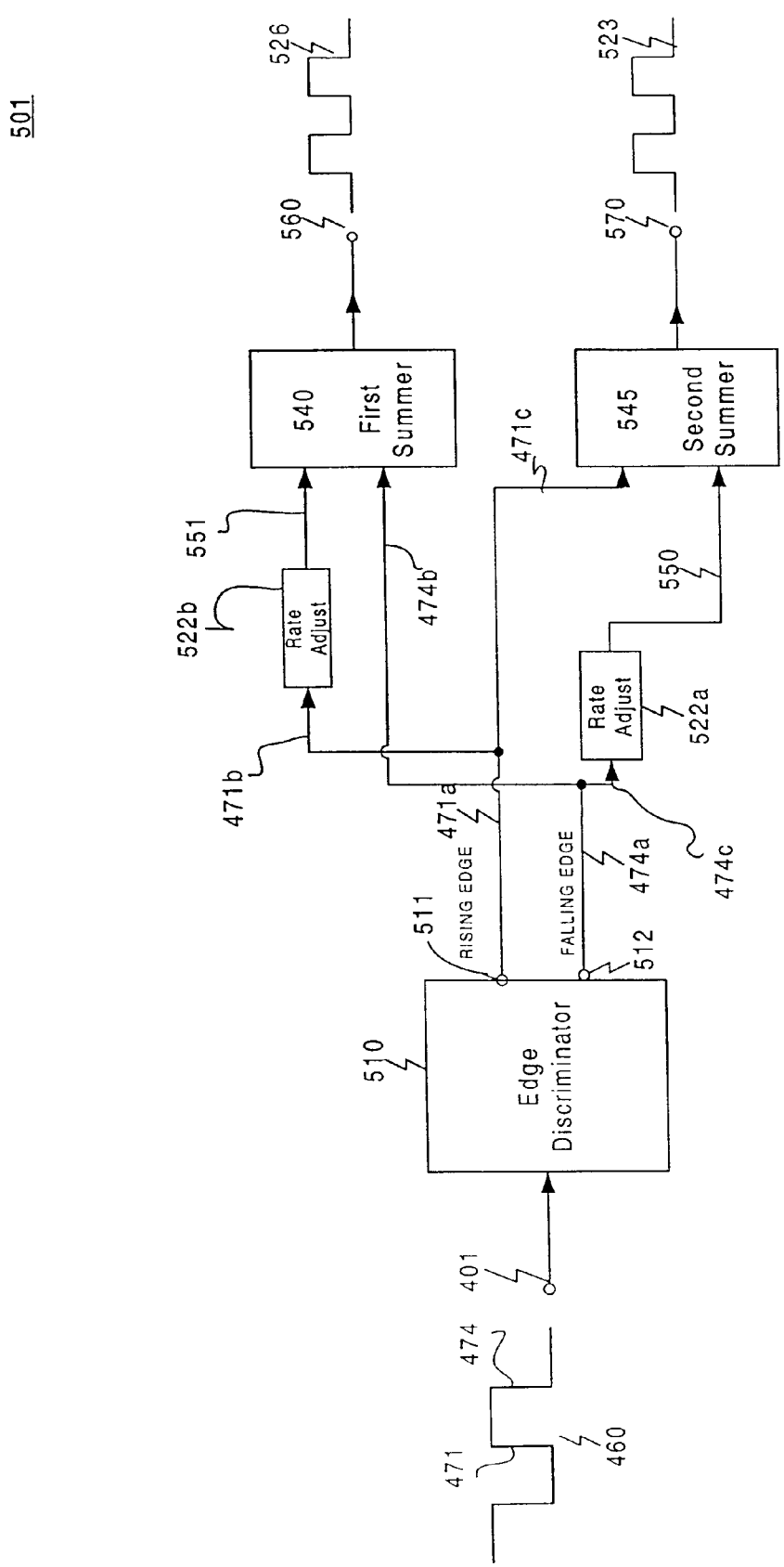
FIG. 5B illustrates an alternate embodiment of the control signal generator.

FIG. 5B illustrates an alternate multi-phase alignment circuit 501. The alternate multi-phase alignment circuit 501 comprises the multi-phase alignment circuit 500 and a rate adjust 522b coupled between the rise output 511 and the first summer 540. The rate adjust 522b sets the slope of the rising edge signal 471b and outputs an adjusted rising edge signal 551. The first summer 540 sums the falling edge signal 474b and the adjusted rising edge signal 551 to output a second adjusted clock signal 526. In a manner analogous to the adjusted falling edge signal 550, the adjusted rising edge signal 551 provides an adjustable offset between the rising edge signal 471c in the adjusted clock signal 523 and the adjusted rising edge signal 551 in the second adjusted clock signal 526.

FIG. 6 illustrates the clock signal 524 and the adjusted clock signal 523. The clock signals edge transitions are exaggerated to illustrate timing details.

The clock signal 524 comprises a clock rising edge 680 and a clock falling edge 682. The adjusted clock signal 523 comprises am adjusted clock rising edge 681 and an adjusted clock falling edge 683. The clock signal 524 is coupled to the sample switch control line 165 and controls when the sample switch 120 opens and closes. The adjusted clock signal 523 is coupled to the sample ground control line 310 and controls when the sample ground switch 150 opens and closes.

The rate adjust 522 sets the slope of the adjusted falling edge 683. The start of the falling edge signal 474b is aligned with the adjusted falling edge signal 550. The rate adjust 522 affects only the slope of the adjusted falling edge signal 550. The adjusted falling edge signal 550 and the falling edge signal 474b begin at a time $T_3$ 645. The adjusted falling edge signal 550 ends at a $T_4$ 650 The falling edge signal 474b ends at a $T_5$ 655.

The sample switch 120 closes at a $T_C$ 656. $T_C$ 656 occurs when the clock signal 524 is rising and midway between the minimum and maximum clock signal 524 amplitude. The sample switch 120 opens, at a $T_O$ 665, when the clock signal 524 is falling and midway between the maximum and minimum clock signal 524 amplitude. The sample ground switch 150 closes at the $T_C$ 656. The sample ground switch 150 opens, at a $T_{FO}$ 660. $T_{FO}$ 660 is the time when adjusted clock signal 523 is falling and midway between the maximum and minimum adjusted clock signal 523 amplitude. A $\Delta t$ 675 is the difference between $T_{FO}$ 660 and $T_O$ 665. Adjusting the slope of the adjusted clock falling edge 683 controls the magnitude of the $\Delta t$ 675.

The multi-phase alignment circuit has several advantages.

First, the multi-phase clock circuit does not use delay devices to vary the $\Delta t$ 675. This eliminates the disadvantages of using delay elements discussed with reference to the control signal generator 300. When the adjusted clock falling edge 683 slope is set equal to the clock falling edge 682 the $\Delta t$ is zero. The multi-phase alignment circuit 500 enables clock edge alignments between zero and a desired delay. The maximum delay is limited only by the ability of circuit elements embodying the invention to increase the slope of adjusted falling edge signal 550.

Second, the multi-phase alignment circuit 500 recovers the clock period equal to the difference between $T_D$ 476 and $\Delta t$ 675.

Figure 7:
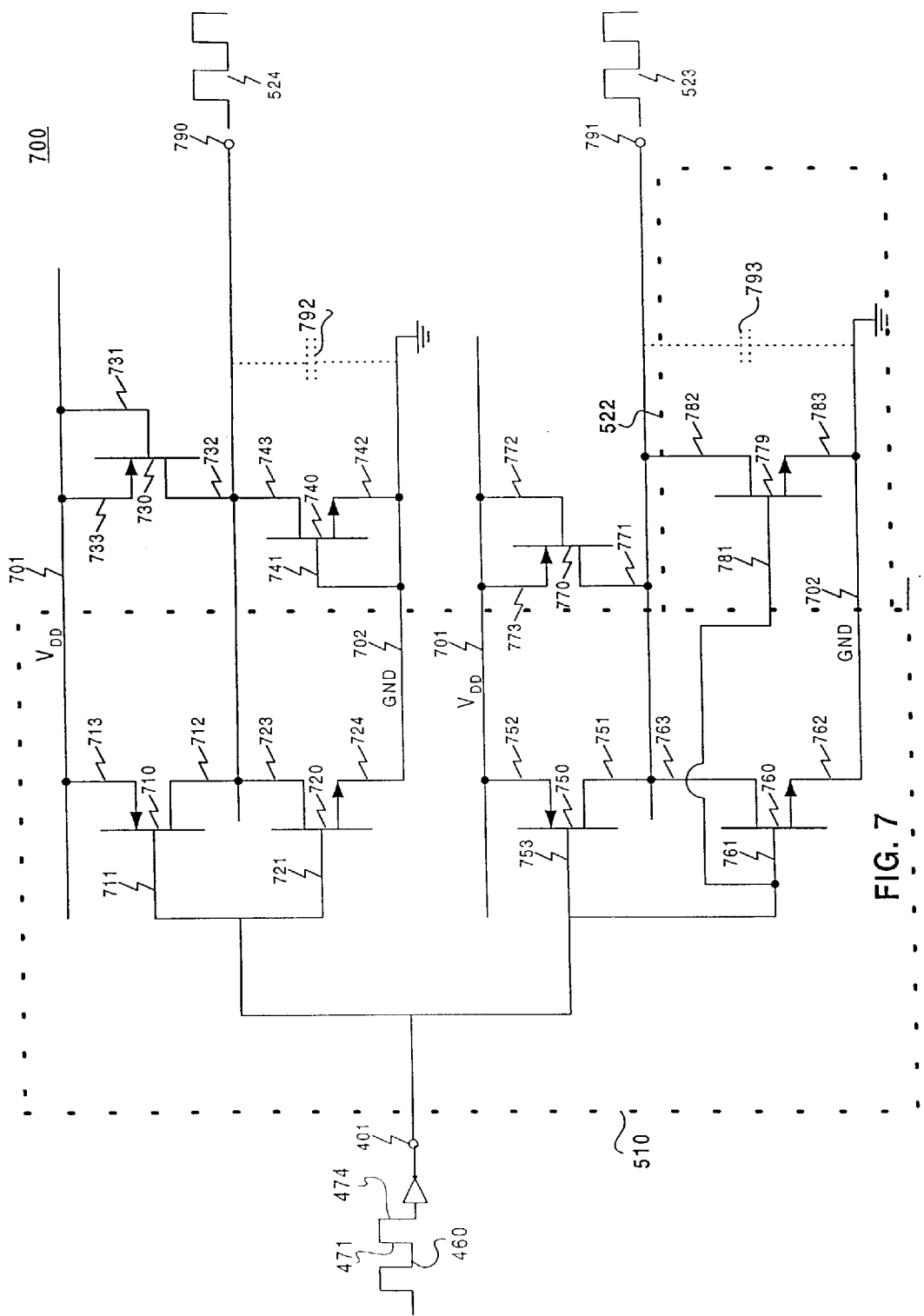
FIG. 7 illustrates details of a multi-phase alignment circuit.

FIG. 7 is a multi-phase alignment circuit 700. The multi-phase alignment circuit 700 comprises the input 401 coupled to a first gate 711, a second gate 721, a third gate 753, a fourth gate 761, and a fifth gate 781. A first source 713 is coupled to a first drain 712, a first transistor 710, and the first gate 711. A second source 724 is coupled to a second drain 723, a second transistor 720, and the second gate 721. A third source 752 is coupled to the third gate 753, a third transistor 750 and a third drain 751. A fourth source 762 is coupled to the fourth gate 761, a fourth transistor 760, and a fourth drain 763. A fifth source 783 is coupled to the fifth gate 781, a fifth transistor 779, and a fifth drain 782. A sixth source 773 is coupled to a sixth gate 772, a sixth transistor 770, and a sixth drain 771. A seventh source 742 is coupled to a seventh gate 741, a seventh transistor 740, and a seventh drain 743. An eighth source 733 is coupled to an eighth gate 731, an eighth transistor 730, and an eighth drain 732.

The sixth transistor 770, the seventh transistor 740, and the eighth transistor 730 function as load devices. The fifth transistor 779, sixth transistor 770, seventh transistor 740, and the eighth transistor 730 are selected to have identical impedance characteristics. When the first transistor 710 and the third transistor 750 are conducting, the impedance at the first drain 712 and the third drain 751 must be equal for the rising edge 471 to have the same slope in the clock signal 524 and the adjusted clock signal 523.

When the second transistor 720, the fourth transistor 760 and the fifth transistor 779 are conducting, the impedance at the second drain 723, the fourth drain 763, and the fifth drain 782 must be equal for the additional current from the fifth transistor 779 to set the difference between the slope of the clock falling edge 682 and the slope of the adjusted clock falling edge 683.

A voltage supply 701 is coupled to the first source 713, the third source 752, the sixth source 773, the sixth gate 772, the eighth source 733, and the eighth gate 731.

A ground 702 is coupled to the second source 724, the fourth source 762, the fifth source 783, the seventh gate 741, and the seventh source 742.

A first summer 790 is coupled to the first drain 712, the second drain 723, the seventh drain 743, the eighth drain 732.

A second summer 791 is coupled to the third drain 751, the fourth drain 763, the fifth drain 782, the sixth drain 771. As shown in FIG. 7, the summer 790 and 791 can be nodes that sum currents from the appropriate transistors.

A first capacitive load 792 is coupled between the first summer 790 and the ground 702. A second capacitor 793 is coupled between the second summer 791 and the ground 702. The first capacitive load 792 and the second capacitive load 793 are not a required circuit element and are shown only to visualize the inherent device capacitances. Although not required, alternate embodiments could add capacitance to balance unmatched semiconductor devices or provide a more precise means of slope control than adding additional transistors.

The first device capacitance 792 is a lumped element representation of the gate-source, gate-drain, and other capacitance inherent in the transistors coupled to the first summer 790. The second device capacitance 793 is a lumped element representation of the gate-source, gate-drain, and other capacitance inherent in the transistors coupled to the second summer 791. The first device capacitance 790 must be the same as the second device capacitance 791 for the clock rising edge 680 and the adjusted clock rising edge 681 to have the same slope and remain aligned.

At steady state the clock signal 524 and the adjusted clock signal 523 are equal to the voltage supply 701.

Referring to FIG. 7, the input clock 460 is inverted and applied to input 401 and the first gate 711, the second gate 721, the third gate 753, the fourth gate 761, and the fifth gate 781. The rising edge 471 of the input clock 460 lowers the reverse gate to source bias on the first transistor 710 and the third transistor 750. The first transistor 710 begins to conduct current from the first source 713 to the first drain 712. The drain current increases the voltage at the first summer 790 and across the first device capacitance 792. The voltage at the first summer 790 is output as clock signal 524. The rate of change or slope in the clock signal 524 is proportional to the first device capacitance 792.

The third transistor 750, simultaneous with the first transistor 710, begins to conduct current from the third source 752 to the third drain 751. The rising voltage at second summer 791 is output as the adjusted clock rising edge 681. The slope in the adjusted clock rising edge 681 is proportional to the second device capacitance 793.

When the falling edge 474 of the input clock 460 is applied to the input 401, the first transistor 710 and the third transistor 750 are reverse biased and stop conducting. The falling edge 474 simultaneously causes the second transistor 720 to conduct. The voltage at the first summer 790 and across first device capacitance 792 decreases and is output as the clock falling edge 682 of the clock signal 524. The first device capacitance 792 is unchanged. The magnitude of the slope of the clock falling edge 682 will remain the same as it was for the clock rising edge 680.

The falling edge 474 also causes the fourth transistor 760, and the fifth transistor 779 to conduct. The second device capacitance 793 is unchanged.

The fourth transistor 760 and the fifth transistor 779 are both decreasing the voltage at the second summer 791 which is also across the second device capacitance 793 The rate of voltage change is directly proportional to current flow. Therefore, the additional current from the fifth transistor 779 will increase the slope of the adjusted clock falling edge 683. The increased slope of adjusted clock falling edge 683 pulls down the voltage at the second summer 791 faster than the second transistor 720.

The device capacitance 792 must also be equal to the second device capacitance 793 to keep the clock falling edge 682 and the adjusted clock falling edge 683 aligned. The first device capacitance 792 and the second device capacitance 793 must also be equal to keep the clock rising edge 680 and the adjusted clock rising edge 681 aligned. In one embodiment the first device capacitance 792 and the second device capacitance 793 are matched by placing transistors with substantially identical characteristics in corresponding positions in the other circuit. For example, the following transistor pairs should be selected to have the same characteristics, the first transistor 710 and the third transistor 750, the second transistor 720 and the fourth transistor 760, the fifth transistor 779 and the seventh transistor 740, and the sixth transistor 770 and the eighth transistor 730.

The slope of the adjusted clock falling edge 683 is controlled by adding or removing transistors with their gate coupled to the input 401 and conducting in parallel with the fifth transistor 779. If the fifth gate 781 is coupled to the ground 702, the adjusted clock falling edge 683 will be identical to the clock falling edge 682.

If an additional transistors is added, it must be mirrored by an identical transistor to keep the first device capacitance 792 equal to the second device capacitance 793. For example, if two additional transistors have their sources, gates and drains coupled identically to the fifth transistor 779, two identical transistors with their sources, drains, and gates coupled like the seventh transistor 740.

Figure 8:
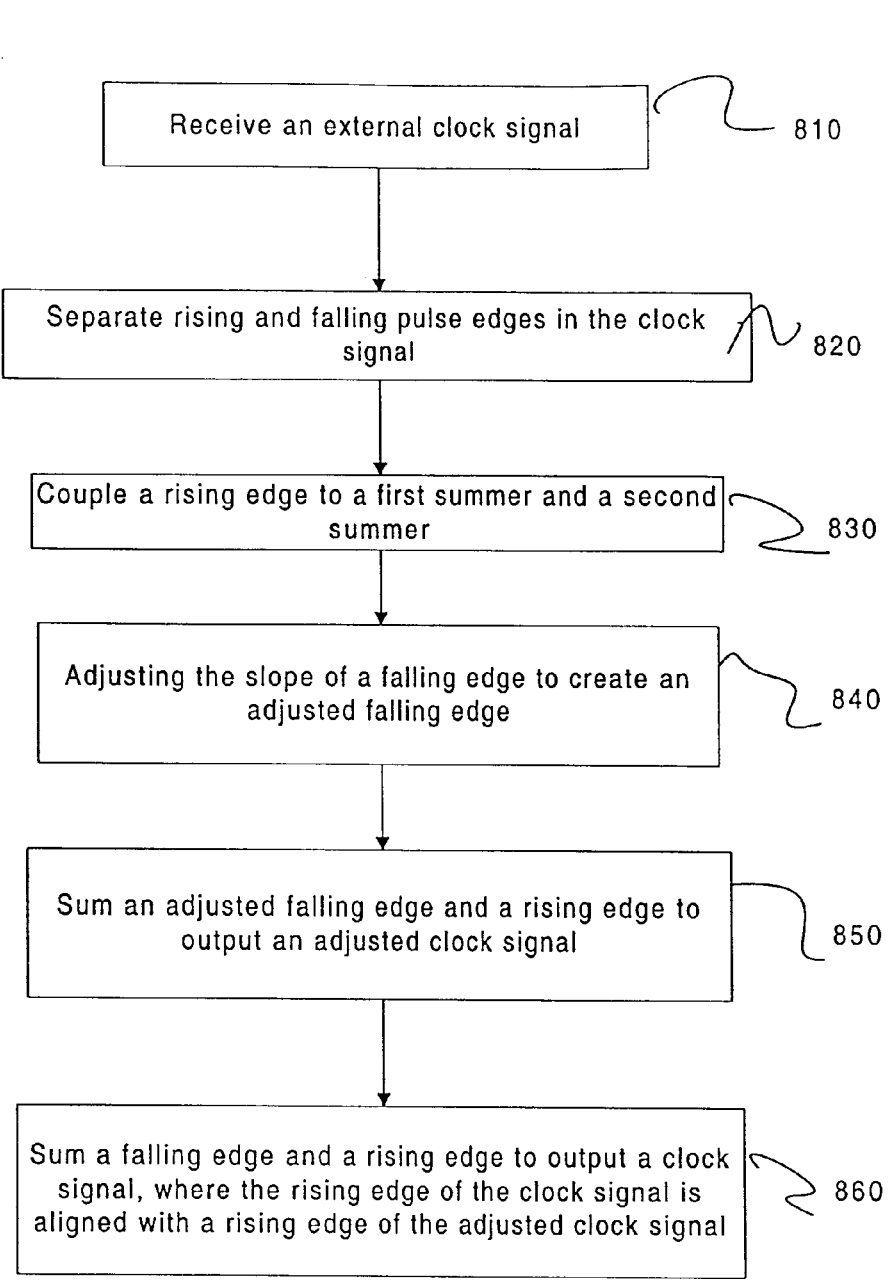
FIG. 8 illustrates steps of a method for generating multi-phase control signals.

FIG. 8 illustrates a method for generating a multi-phase clock according to the present invention. In step 8 10, an external clock signal is received. In step 820, the clock signal is separated into rising edges and falling edges. In step 830, the rising edges are coupled to a first and second summer. In step 840, the slope of the falling edge is adjusted to create an adjusted falling edge. In step 850, the adjusted falling edge and rising edge are summed to output an adjusted clock signal. In step 860, a falling edge and rising edge are summed to output a clock signal.

Figure 9:
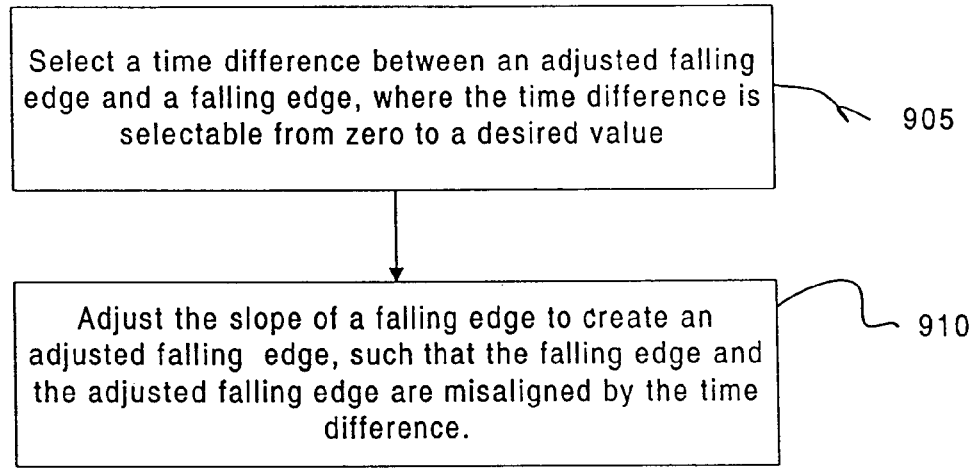
FIG. 9 illustrates details of a method step for adjusting a falling edge slope.

FIG. 9 illustrates details of method step 840. In step 905, a time difference between an adjusted falling edge and a falling edge is selected. The time difference is selectable from zero to a desired value. In step 910, The slope of a falling edge is adjusted to create an adjusted falling edge. A falling edge and the adjusted falling edge are misaligned by the calculated time difference.

CONCLUSION

Example embodiments of the methods, circuits, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. An alignment circuit comprising:

an input;

an edge discriminator coupled to said input, said edge discriminator having a rise output and a fall output;

a first summer coupled to said rise output and said fall output;

a rate adjust coupled to said fall output;

a second summer coupled to the rise output and said rate adjust;

a clock output terminal coupled to said first summer; and an adjusted clock output terminal coupled to said second summer.

2. The alignment circuit of claim 1, wherein the edge discriminator outputs a rising pulse edge at said rise output that corresponds to a signal received at said input and outputs a falling pulse edge at said fall output that corresponds to said signal received at said input.

3. The alignment circuit of claim 2, wherein said rate adjust modifies a slope of said falling pulse edge and outputs an adjusted falling pulse edge to said second summer.

4. The alignment circuit of claim 3, wherein an output from said first summer is a sum of said rising pulse edge and said falling pulse edge.

5. The alignment circuit of claim 3, wherein an output from said second summer is a sum of said adjusted falling pulse edge and said rising pulse edge.

6. The alignment circuit of claim 1 , further comprising:

another rate adjust coupled between said rise output and said first summer, wherein said another rate adjust modifies a slope of a rising pulse edge output from said edge discriminator and outputs an adjusted rising pulse edge and wherein said first summer combines said fall output and said adjusted rising pulse edge.

7. A method of adjusting pulse edges comprising the steps of:

receiving a clock signal;

separating a rising edge and a falling edge of said clock signal;

coupling said rising edge and said falling edge to a first summer;

summing said rising edge and said falling edge in said first summer to generate a clock signal;

adjusting a slope of said falling edge to create an adjusted falling edge;

coupling said adjusted falling edge and said rising edge to a second summer; and summing said adjusted falling edge and said rising edge in said second summer to generate an adjusted clock signal.

8. The method of claim 7, further comprising the steps of:

adjusting the slope of said rising edge to create an adjusted rising edge;

coupling the adjusted rising edge and said falling edge to the first summer; and summing said adjusted rising edge and said falling edge to generate another adjusted clock signal.

9. The method of claim 7, wherein said adjusting step comprises:

selecting a time difference between said adjusted falling edge and said falling edge, wherein said time difference is selectable from zero to a desired value; and adjusting the slope of said falling edge to create said adjusted falling edge, wherein said falling edge and said adjusted falling edge are misaligned by said time difference.

10. The method of claim 8, wherein said adjusting step comprises:

selecting a time difference between said adjusted rising edge and said rising edge, wherein said time difference is selectable from zero to a desired value; and adjusting the slope of said rising edge to create said adjusted rising edge, wherein said rising edge and said adjusted rising edge are misaligned by said time difference.

* * * * *